(12) United States Patent
Tamura et al.

(10) Patent No.: US 9,019,697 B2
(45) Date of Patent: Apr. 28, 2015

(54) ELECTRONIC DEVICE

(71) Applicant: Fujitsu Limited, Kawasaki-shi, Kanagawa (JP)

(72) Inventors: Yoshiaki Tamura, Kawasaki (JP); Masahiko Hoshi, Katsushika (JP); Eiji Takizawa, Sagamihara (JP)

(73) Assignee: Fujitsu Limited, Kawasaki (JP)

( * ) Notice: Subject to any disclaimer, the term of this patent is extended or adjusted under 35 U.S.C. 154(b) by 177 days.

(21) Appl. No.: 13/893,765

(22) Filed: May 14, 2013

(65) Prior Publication Data

US 2014/0029192 A1    Jan. 30, 2014

(30) Foreign Application Priority Data

Jul. 30, 2012    (JP) ................. 2012-168833

(51) Int. Cl.
*G06F 1/16* (2006.01)
*H05K 5/02* (2006.01)
*H05K 7/20* (2006.01)
*G06F 1/18* (2006.01)

(52) U.S. Cl.
CPC ............ *H05K 5/0247* (2013.01); *H05K 7/2039* (2013.01); *G06F 1/187* (2013.01); *G06F 1/1658* (2013.01)

(58) Field of Classification Search
USPC ................ 345/179, 168, 173, 174, 175, 176; 455/575.1, 41.2, 575.4, 566, 572; 439/39, 78, 607.35, 272, 345, 188, 439/751, 816; 362/311.02, 382, 23.19; 165/80.3, 185, 104.25, 104.33, 80.4; 361/692, 679.41, 679.01, 679.56, 361/679.4, 679.33, 679.26, 679.02, 679.21, 361/679.46, 679.55, 679.54, 679.48, 361/679.08, 679.04, 679.32, 679.3, 679.09, 361/679.31, 679.35, 679.44
See application file for complete search history.

(56) References Cited

U.S. PATENT DOCUMENTS

2005/0082036 A1*   4/2005   Minamitani et al. .......... 165/80.3
2012/0127663 A1*   5/2012   Mochizuki et al. ............ 361/692

FOREIGN PATENT DOCUMENTS

| JP | 7-30460 | 6/1995 |
|---|---|---|
| JP | 8-063260 | 3/1996 |
| JP | 2005-128804 | 5/2005 |
| JP | 2010-140510 | 6/2010 |

* cited by examiner

*Primary Examiner* — Hung Duong
(74) *Attorney, Agent, or Firm* — Fujitsu Patent Center

(57) ABSTRACT

An electronic device includes a case, a board disposed inside the case and including a board main body section, a plurality of internal devices that are disposed inside the case at different positions to the board in plan view of the board and that are thicker than the board, a board extension portion that extends out from the board main body section between the plurality of internal devices, a board-side connection terminal that is provided to the board extension portion and is employed to connect to one of the internal devices or to an external device external to the case; and an internal device-side connection terminal that is provided to the internal device and is connected to the board-side connection terminal.

16 Claims, 7 Drawing Sheets

ELECTRONIC DEVICE

CROSS-REFERENCE TO RELATED APPLICATION

This application is based upon and claims the benefit of priority of the prior Japanese Patent Application No. 2012-168833, filed on Jul. 30, 2012, the entire contents of which are incorporated herein by reference.

FIELD

The embodiments discussed herein are related to an electronic device.

BACKGROUND

In an electronic device such as a data processing terminal (for example a notebook style computer), a board and internal devices, such as a storage device, are provided inside a case.

For example, technology is known in which a motherboard is disposed inside a case, with a central processing unit mounted to the motherboard so as not to overlap with a keyboard.

RELATED PATENT DOCUMENTS

Japanese Laid-Open Patent Publication (JP-A) No. 2010-140510.

SUMMARY

According to an aspect of the embodiments, an electronic device includes: a case; a board disposed inside the case and including a board main body section; plural internal devices that are disposed inside the case at different positions to the board in plan view of the board and that are thicker than the board; a board extension portion that extends out from the board main body section between the plural internal devices; a board-side connection terminal that is provided to the board extension portion and is employed to connect to one of the internal devices or to an external device external to the case; and an internal device-side connection terminal that is provided to the internal device and is connected to the board-side connection terminal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding a first exemplary embodiment, with reference to the drawings.

Figure 1:
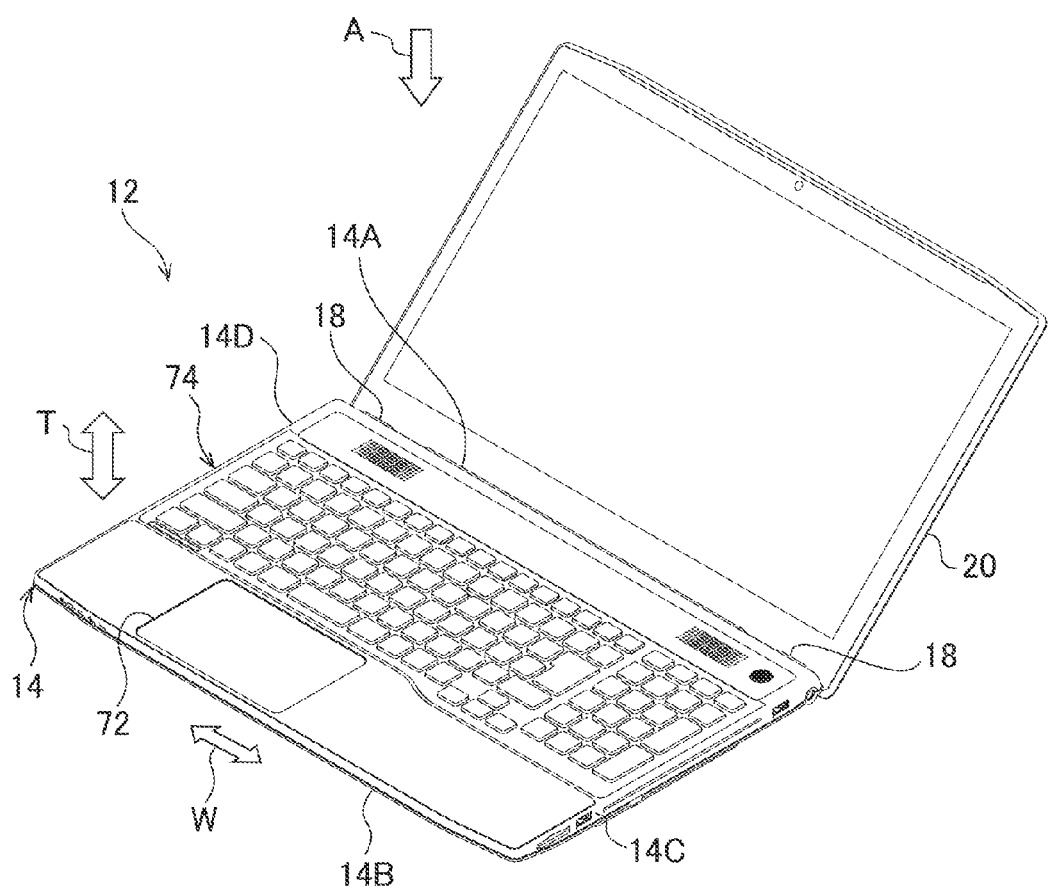
FIG. 1 is a perspective view illustrating a notebook computer of a first exemplary embodiment.
Figure 2:
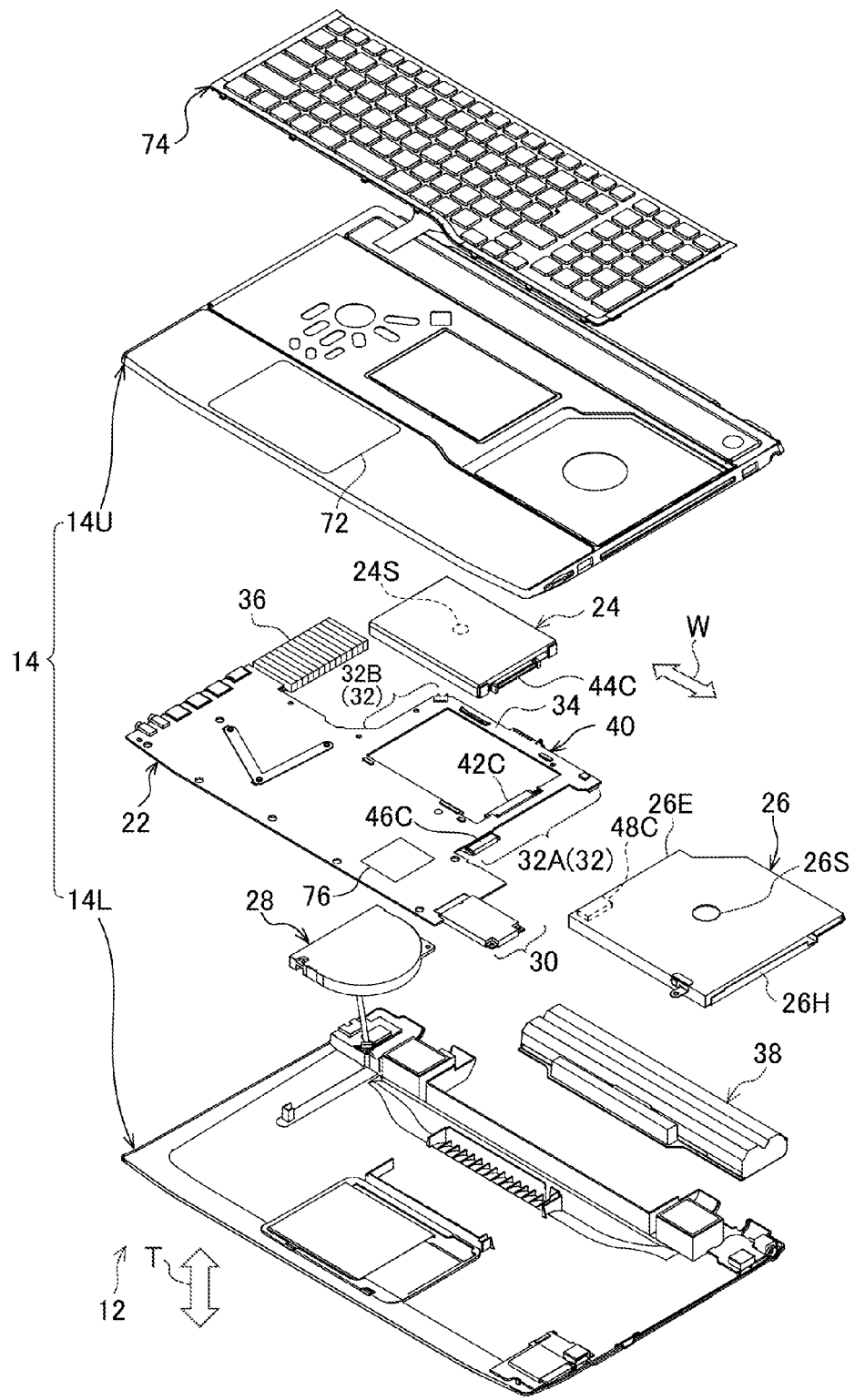
FIG. 2 is an exploded perspective view illustrating portions of a notebook computer of the first exemplary embodiment
Figure 3:
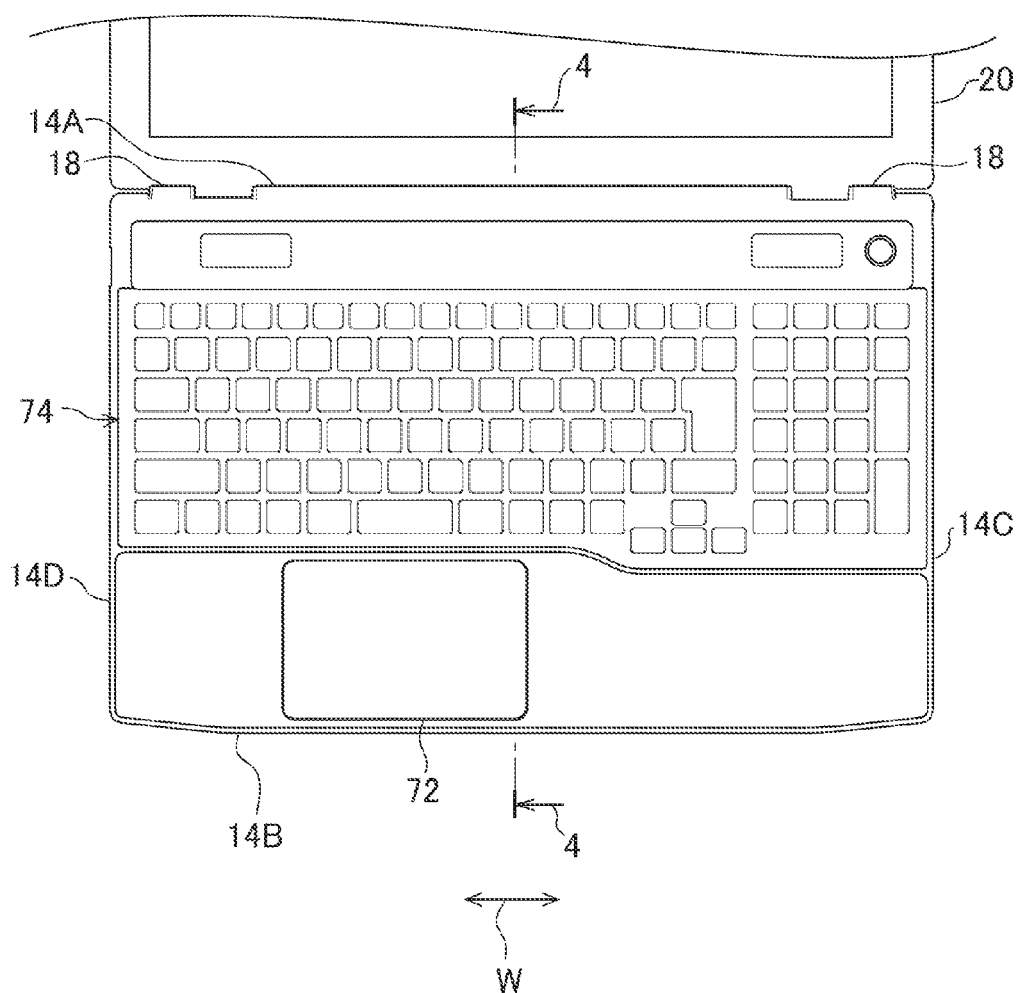
FIG. 3 is a plan view illustrating portions of a notebook computer of the first exemplary embodiment.

As illustrated in FIG. 1 and FIG. 2, in the first exemplary embodiment a notebook style computer (abbreviated below to "notebook computer") 12 is given as an example of an electronic device.

The notebook computer 12 of the present exemplary embodiment includes a case 14. The case 14 is for example formed in a flat box shape. The case 14 is formed in a substantially rectangular shape when viewed in plan view (in the arrow A direction), including a far edge 14A, a near edge 14B, a right edge 14C and a left edge 14D.

Figure 4:
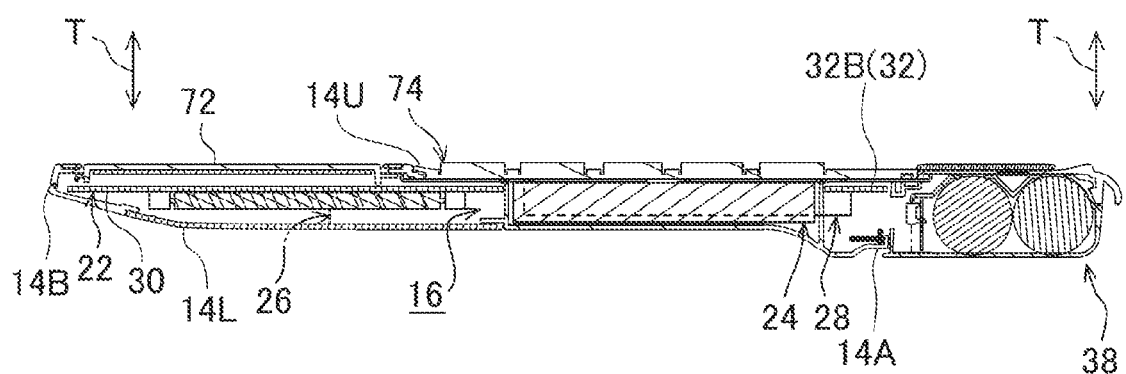
FIG. 4 is a cross-section taken on line 4-4 of FIG. 3 and illustrating portions of a notebook computer of the first exemplary embodiment.

The case 14 of the present exemplary embodiment has a structure divided in the thickness direction (the arrow T direction) into an upper member 14U and a lower member 14L. The upper member 14U and the lower member 14L are engaged with each other in a superimposed state, using engagement members, (or are fastened together using fastening members, such as screws). A housing space 16 is accordingly formed between the upper member 14U and the lower member 14L, as illustrated in FIG. 4.

A display 20 is rotatably attached at the far edge 14A side of the case 14 using a hinge 18. As illustrated in FIG. 4, the shape of the case 14 as viewed from the side face is substantially wedge shaped, with the thickness gradually decreasing continuously or in steps from the far edge 14A side to the near edge 14B side.

As illustrated in FIG. 2, a board 22, a Hard Disk Drive (HDD) 24, an Optical Disk Drive (ODD) 26 and a radiator device 28 are provided inside the case 14 (between the upper member 14U and the lower member 14L). The HDD 24, the ODD 26 and the radiator device 28 each serve as examples of internal devices.

The HDD 24, the ODD 26 and the radiator device 28 are disposed arrayed along one edge of the case 14. Reference simply to the "array direction" in the following means the direction in which the HDD 24, the ODD 26 and the radiator device 28 are arrayed. In the present exemplary embodiment this direction is aligned with the width direction of the case 14 (the arrow W direction).

The HDD 24 has a rotation shaft 24S with length direction oriented in the HDD 24 thickness direction. The HDD 24 rotates a hard disk about the rotation shaft 24S, and performs recording and reading of data to and from the hard disk.

The ODD 26 similarly has a rotation shaft 26S with length direction oriented in the ODD 26 thickness direction. The ODD 26 rotates an optical disk that has been inserted through an insertion opening 26H about the rotation shaft 26S, and performs recording and reading of data to and from the optical disk.

In particular, in the present exemplary embodiment, the HDD 24 is disposed at a central position in the array direction (the arrow W direction), with the ODD 26 disposed at one longitudinal edge (the right edge 14C in FIG. 5) side in the array direction (in the arrow W direction). The insertion opening 26H of the ODD 26 can thereby be exposed to the right edge 14C side, and an optical disk is accordingly readily inserted therein or taken out therefrom.

The radiator device 28 includes a radiator fan, enabling heat inside the case 14 to be externally discharged by externally discharging air inside the case 14 to outside the case. In the present exemplary embodiment, the radiator device 28 is disposed at the other longitudinal edge (the left edge 14D in FIG. 5) side in the array direction (in the arrow W direction). It is accordingly possible to externally discharge air from inside the case 14 through an exhaust outlet 14G formed in the case 14 when the radiator fan is being driven.

The board 22 includes a board main body section 30. A central processing unit 76, a main storage device and various types of processing circuit are mounted to the board main body section 30.

In the present exemplary embodiment, in plan view the board main body section 30 has a width that is wider than that of the HDD 24 (in effect from the vicinity of the right edge 14C to the vicinity of the left edge 14D). Note that the board main body section 30 is disposed so as to be positioned nearer to the near edge 14B than the HDD 24, the ODD 26 and the radiator device 28. In other words, the board main body section 30 is disposed in a position further away from the far edge 14A than the HDD 24, the ODD 26 and the radiator device 28.

Note that radiator fins 36 are provided to the board main body section 30 at a position on the airflow downstream side from the radiator device 28. Airflow generated by driving the radiator device 28 passes by the radiator fins 36, in a structure capable of achieving effective cooling from the radiator fins 36 of the board 22 and various peripheral members.

A battery 38 is attached outside the far edge 14A of the case 14 and running along the far edge 14A.

The board 22 includes board extension portions 32 that extend from the board main body section 30 towards the far edge 14A. The present exemplary embodiment includes, in plan view, a first extension portion 32A that extends from the left hand side of the ODD 26 to between the HDD 24 and the ODD 26, and a second extension portion 32B that is positioned between the HDD 24 and the radiator device 28. A frame shaped portion 40 is also formed by coupling together the leading end of the first extension portion 32A and the leading end of the second extension portion 32B using a board coupling portion 34. The frame shaped portion 40 is formed in a shape so as to surround one (or plural) of the internal devices. In the present exemplary embodiment the frame shaped portion 40 is formed in a rectangular shape in plan view so as to be slightly larger than the HDD 24 in plan view.

Figure 5:
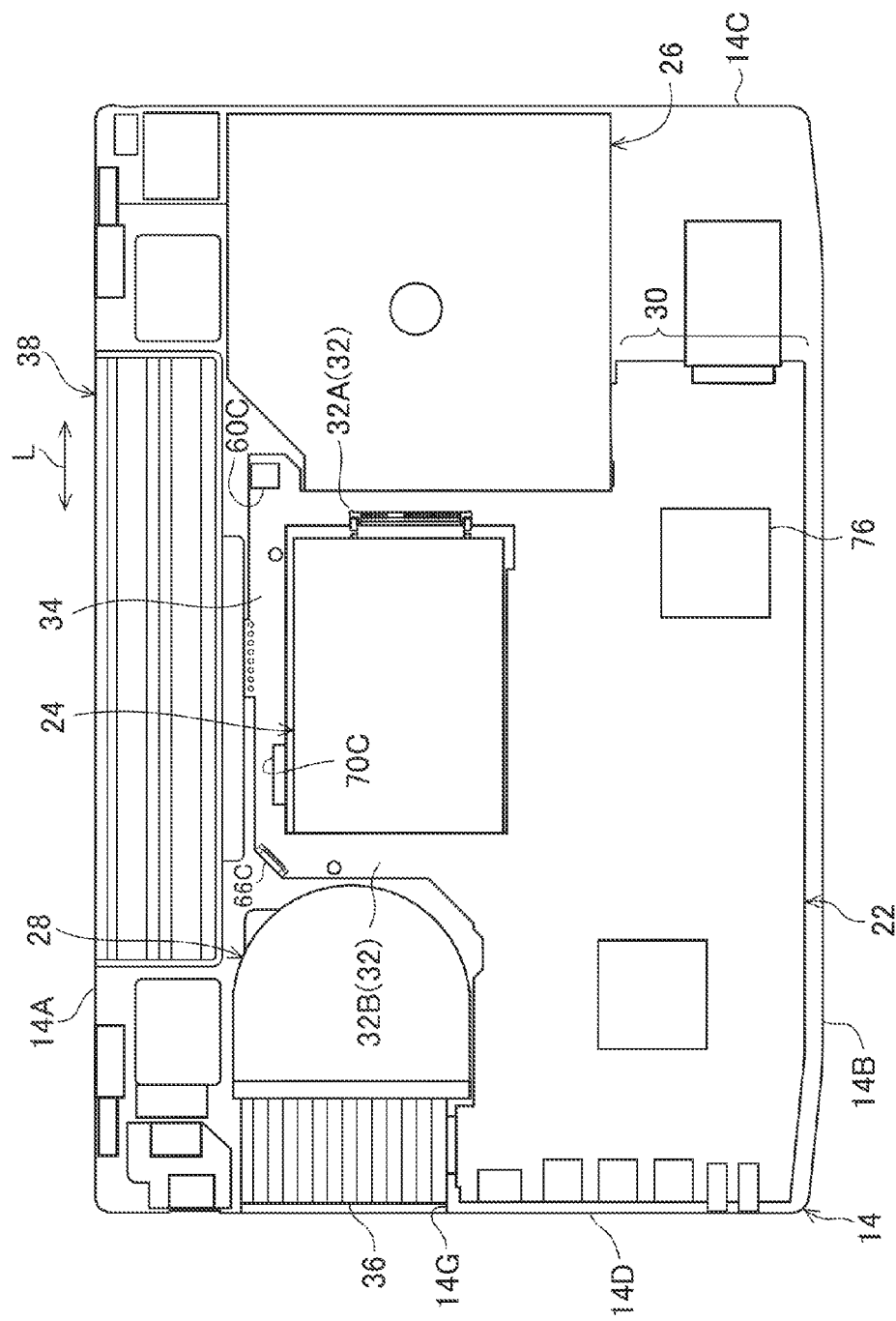
FIG. 5 is a plan view illustrating a structure inside a case of a notebook computer of the first exemplary embodiment.

As illustrated in FIG. 5, the board 22 has a shape and a position so as not to overlap with the HDD 24, the ODD 26 or the radiator device 28 in plan view. Moreover, as illustrated in FIG. 2 and FIG. 4, the thicknesses of the HDD 24, the ODD 26, the radiator device 28 and the battery 38 are thicker than that of the board 22.

Figure 6:
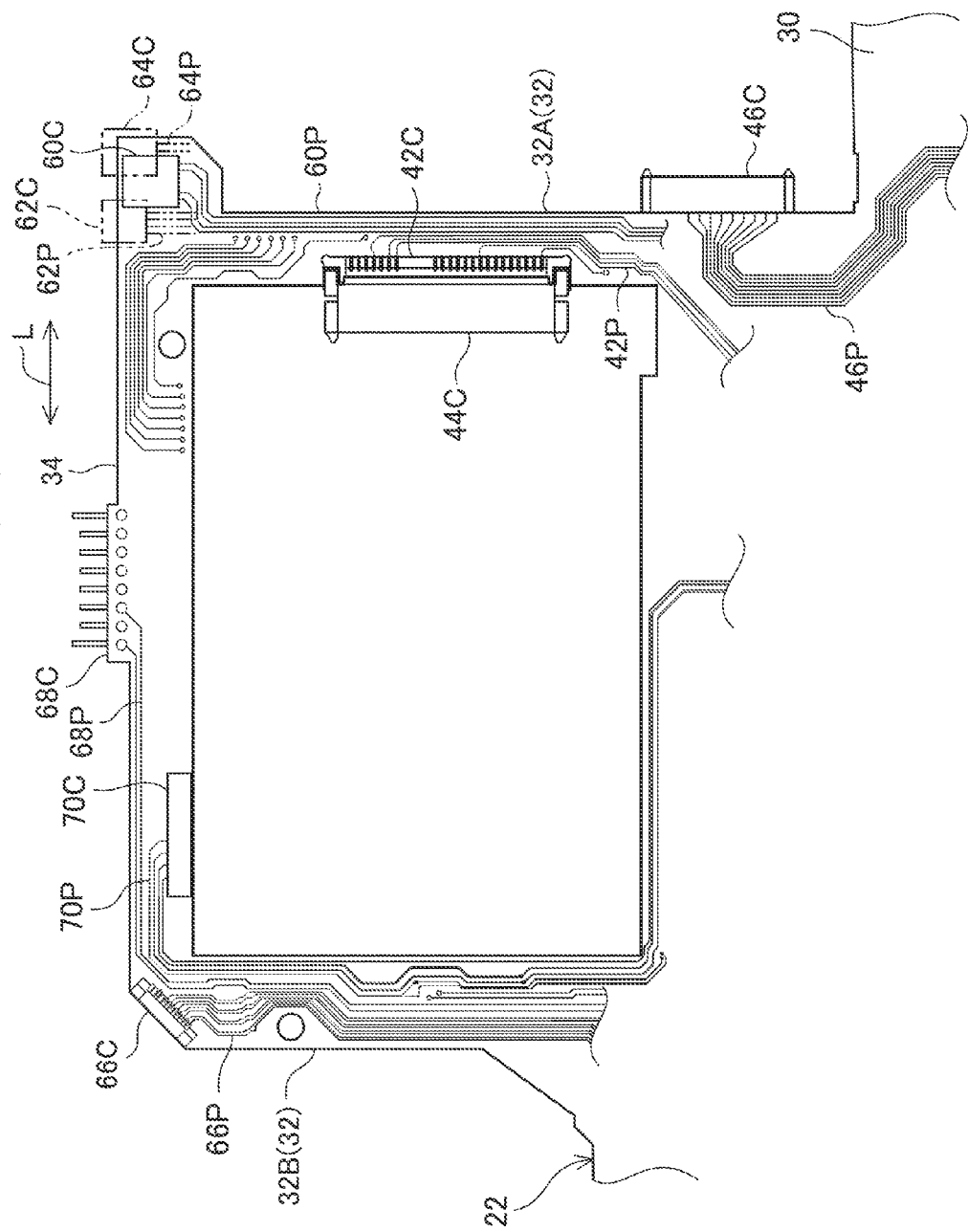
FIG. 6 is an enlarged plan view illustrating portions of a board of a notebook computer of the first exemplary embodiment.

As illustrated in FIG. 6, HDD connectors 42C, 44C are respectively provided to the first extension portion 32A and the HDD 24 in order to electrically connect the board 22 and the HDD 24 together directly (not through a cable). The HDD connector 42C is an example of a board-side connection terminal, and the HDD connector 44C is an example of an internal device-side connection terminal.

Figure 7:
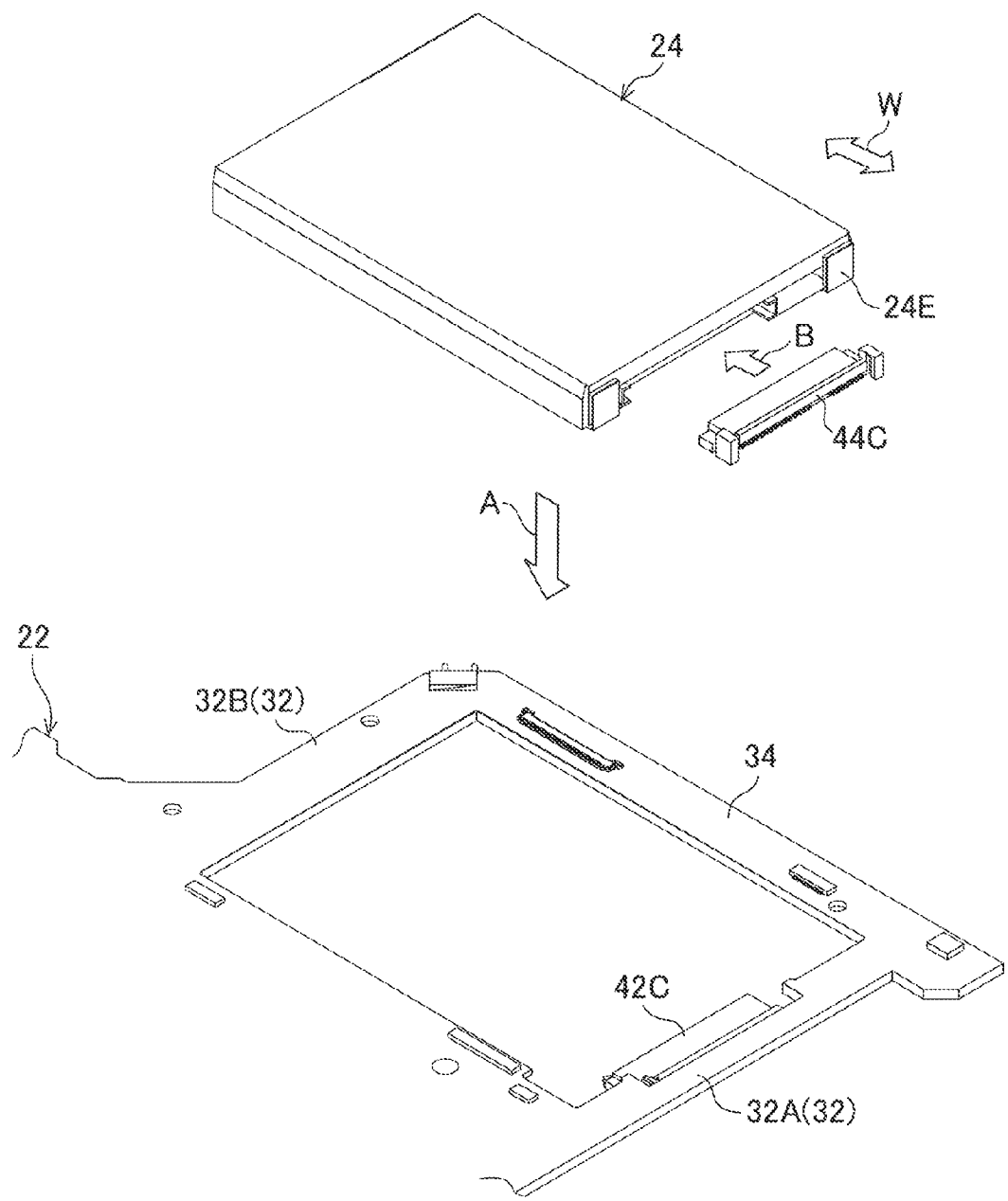
FIG. 7 is an enlarged perspective view illustrating an HDD and a board of a notebook computer of the first exemplary embodiment.

As illustrated in FIG. 7, a HDD connector 44C of the HDD 24 is detachable from the HDD 24 and is attached to a side edge 24E. The HDD connector 44C can be attached to the HDD 24 from the arrow B direction. In the attached state of the HDD connector 44C to the HDD 24, the connection portion to the HDD connector 42C faces in the HDD 24 thickness direction (downwards in the illustrated example). Correspondingly, the HDD connector 42C of the first extension portion 32A also faces in the board 22 thickness direction (upwards in the illustrated example) so as to enable connection of the HDD connector 42C to the HDD connector 44C of the HDD 24.

Due to employing the thus configured HDD connectors 42C, 44C, electrical connection between the HDD 24 and the board 22 is enabled not by sliding the HDD 24 in the across direction (the arrow W direction) but rather by moving the HDD 24 in the thickness direction (the arrow A direction) into the close vicinity of the board 22. Space for sliding the HDD 24 in the across direction is accordingly not needed, and a structure is achieved in which it is possible to provide the board extension portions 32 where such space would have been provided.

ODD connectors 46C, 48C are respectively provided to the board main body section 30 and the ODD 26 to electrically connect the board 22 and the ODD 26 together directly (not through a cable). The ODD connector 46C serves as an example of a board-side connection terminal and the ODD connector 48C serves as an example of an internal device-side connection terminal.

The ODD connector 48C of the ODD 26 is attached to a side edge 26E so as to face the HDD 24. The ODD connector 48C of the ODD 26 is provided at a position displaced from the HDD connector 44C of the HDD in the direction along the side edge 26S (the extension direction of the side edge 26S).

A structure that might, for example, be considered here is a structure in which the ODD connector 48C is provided facing towards the HDD connector 44C. That is to say, a structure in which the HDD connector 44C and the ODD connector 48C are in the same position as each other in the direction along the side edge 26S.

In such cases, due to the HDD connector 42C and the ODD connector 46C of the first extension portion 32A also then being in the same position as each other, the first extension portion 32A between the HDD connector 42C and the ODD connector 46C is made narrower in width by the amounts of the HDD connector 42C and the ODD connector 46C. Namely, in order to try to secure certain width in the first extension portion 32A between the HDD connector 42C and the ODD connector 46C, a width of the sum of the board extension portion 32, the HDD connector 42C and the ODD connector 46C is needed at this portion, resulting in a wider width.

In contrast thereto, in the present exemplary embodiment the ODD connector 46C is provided in a position displaced from the HDD connector 42C, thereby enabling a shape to be realized that is not excessively wide in width whilst still securing the certain space for the board extension portions 32.

A speaker connector 60C employed for connecting to a speaker is provided at the boundary portion of the first extension portion 32A and the board coupling portion 34. A USB connector 62C employed for connecting to a board for mounting a Universal Serial Bus (USB) port is provided at the boundary portion of the first extension portion 32A and the board coupling portion 34. A power cable connector 64C that connects to a power cable is also provided at the boundary portion of the first extension portion 32A and the board coupling portion 34.

A LAN port connector 66C employed for connecting to a LAN port is provided to the boundary portion of the second extension portion 32B and the board coupling portion 34.

A battery connector 68C employed for connecting to the battery 38 and a display connector 70C for connecting to the display 20 are provided to the board coupling portion 34.

An HDD wiring line pattern 42P employed for performing signal communication with the HDD connector 42C and a speaker wiring line pattern 60P employed for transmitting signals to the speaker connector 60C are provided to the first extension portion 32A. A USB wiring line pattern 62P employed for performing signal communication with the USB connector 62C is also provided as internal wiring to the first extension portion 32A. An ODD wiring line pattern 46P employed for performing signal communication with the ODD connector 46C is provided to the board main body section 30.

A LAN port wiring line pattern 66P employed for performing signal communication with the LAN port connector 66C is provided to the second extension portion 32B. A display wiring line pattern 70P employed for transmitting signals to the display connector 70C is also provided to the second extension portion 32B and the board coupling portion 34.

A power cable wiring line pattern 64P that receives power from the power cable connector 64C and a battery wiring line pattern 68P employed for performing power exchange with the battery connector 68C are provided to the board coupling portion 34.

Each of the types of wiring line pattern are provided distributed over the two (plural) board extension portions 32. In particular, the example described above is a structure that does not have excessive concentration of the wiring line patterns in any one of the board extension portions 32. Consequently, the board extension portions 32 can be suppressed from becoming extremely wide or narrow compared to a structure in which wiring line patterns are concentrated in one or the other of the board extension portions 32.

Note that connectors such as the speaker connector 60C, the USB connector 62C, the LAN port connector 66C, the battery connector 68C and the display connector 70C are examples of board-side connection terminals.

As illustrated in FIG. 1 to FIG. 4, an operation pad 72 is provided on the upper face side of the upper member 14U, and a keyboard 74 is also attached thereto. It is accordingly possible for a user of the notebook computer 12 to use the operation pad 72 and the keyboard 74 to perform input operations.

In particular, in the present exemplary embodiment a portion of the keyboard 74 and a portion of the board main body section 30 overlap with each other when the case 14 is viewed in plan view.

Explanation follows regarding operation of the notebook computer 12.

The notebook computer 12, as illustrated in FIG. 2, has a structure in which the HDD 24, the ODD 26 and the radiator device 28 inside the case 14 do not overlap with the board 22 in the board 22 thickness direction. It is accordingly possible to achieve a slimmer case 14 than in a structure in which any of the HDD 24, the ODD 26 or the radiator device 28 overlaps with the board 22.

In particular, the board main body section 30 is disposed further to the near edge 14B side than the HDD 24, the ODD 26 and the radiator device 28. It is accordingly possible to achieve a slimmer case at the far edge 14A side than for example in a configuration in which a portion of the board 22 overlaps with any of the HDD 24, the ODD 26 or the radiator device 28 at the far edge 14A side.

Moreover, in the present exemplary embodiment, the HDD 24, the ODD 26 and the radiator device 28 inside the case 14 are disposed along the far edge 14A of the case 14. The board main body section 30 is disposed further towards the near edge 14B side of the case 14 than these internal devices. The board 22 is thinner than these internal devices, and as illustrated in FIG. 4, it is possible to achieve a shape (a substantially wedge shaped side face) in which the thickness gradually decreases continuously or in steps from the far edge 14A side towards the near edge 14B side.

Furthermore, in the present exemplary embodiment, the HDD 24, the ODD 26 and the radiator device 28 that are thicker than the board 22 are disposed along the far edge 14A of the case 14. Accordingly, the case 14 can be made slimmer than in a structure in which any of these members are disposed at a position near to the near edge 14B of the case 14, thereby facilitating the substantially wedge shaped side face of the case 14 referred to above.

In addition, the central processing unit 76 is installed to the board main body section 30 of the case 14. The HDD 24, the ODD 26 and the radiator device 28 do not overlap with the board main body section 30, thereby enabling sufficient space to be secured for mounting the central processing unit 76.

Moreover, in the present exemplary embodiment, the display 20 is provided at the far edge 14A of the case 14. Namely, a user employs the notebook computer 12 from the comparatively thin side of the case 14 (the near edge 14B side). This enables a slight slope to be achieved overall for the case 14 such that the near edge 14B side of the case 14 is lower during use of the notebook computer 12, thereby achieving a structure with excellent input operation through the keyboard 74 and contact operation to the operation pad 72.

Structure is such that the first extension portion 32A and the second extension portion 32B extend out from the board main body section 30, and the first extension portion 32A and the second extension portion 32B are also coupled together by the board coupling portion 34. Wiring cables for connecting the HDD 24 and the ODD 26 to the board would for example need to be provided to boards that lack such provision of the first extension portion 32A, the second extension portion 32B and the board coupling portion 34. A wiring cable for connecting together the display 20 and the board would be particularly long due to the display 20 being disposed at a position on the far edge 14A side, namely at a position away from the board main body section 30. There is accordingly a concern that a structure having such a wiring cable would lead to an increase in cost of an electronic device.

In contrast thereto, the board extension portions 32 that are portions of the board 22 are employed in the present exemplary embodiment as a structure to electrically connect the HDD 24 and the ODD 26 to the display 20. A wiring cable is accordingly rendered redundant (or it is possible to shorten a wiring cable), enabling wiring to be simplified. A reduction in manufacturing cost of the electronic device is also possible due to elimination of a process for wiring lay-out. Space inside the case 14 for laying out such a wiring cable is also not needed, thereby enabling space to be saved.

Moreover, in the present exemplary embodiment, the HDD 24 is connected by the HDD connectors 42C, 44C by moving in the thickness direction with respect to the board 22, so as to be incorporated in a specific position inside the case 14. Namely, since there is no need to slide the HDD 24 with respect to the board 22 in the across direction, the space of such a sliding amount is efficiently utilized in the provision of the board extension portions 32 (the first extension portion 32A and the second extension portion 32B).

The HDD connector 44C and the ODD connector 48C are also provided in positions displaced from each other along the side edge 26S of the ODD 26. Excessive widening is accordingly avoided whilst still securing the width needed for the board extension portion 32, thereby achieving efficient utilization of space.

Note that although in the above there are two of the board extension portions 32 (the first extension portion 32A and the second extension portion 32B) that extend out from the board main body section 30, configuration may also be made with only a single board extension portion provided, or with 3 or more board extension portions provided. When two or more of the board extension portions 32 are provided, it is possible to simplify wiring line patterns while suppressing the width of the respective board extension portions by providing the wiring line patterns to internal devices and external devices distributed between these board extension portions.

Moreover, due to providing each of the types of wiring line pattern distributed across two (plural) of the board extension portions 32, the board extension portions 32 can be suppressed from becoming extremely wide in width or extremely narrow in width compared to a structure in which the wiring line patterns are each concentrated on one or the other of the board extension portions 32.

In particular, in a structure in which the first extension portion 32A and the second extension portion 32B are coupled together by the board coupling portion 34, if the wiring line patterns are unevenly distributed on one of the board extension portions 32, then the board coupling portion 34 also becomes excessively wide at the portion where this wiring line pattern extends to the board coupling portion 34. The board coupling portion 34 can be suppressed from becoming excessively wide by distributing each of the wiring line patterns over two (plural) of the board extension portions 32.

Moreover, the frame shaped portion 40 is formed by the first extension portion 32A, the second extension portion 32B and the board coupling portion 34. The strength of the board 22 is accordingly stronger than in structures not formed with such a frame shaped portion 40. The board coupling portion 34 of the frame shaped portion 40 is also positioned further to the far side than the internal device (the HDD 24), thereby enabling efficient utilization of space at the far side of the internal device.

An example has been given above in which the HDD 24 and the ODD 26 serve as examples of internal devices. These are often thicker than the board 22 due to being members that have internal rotation shafts (spindles) with axial directions oriented in the board 22 thickness direction. The radiator device 28 is also configured with a rotation shaft with axial direction oriented in the board 22 thickness direction, and with a fan blade member that rotates about the rotation shaft. Even in structures with members having rotation shafts provided inside the case 14 it is possible to achieve a slimmer case 14 by, as in the above exemplary embodiment, disposing the internal devices on the far edge 14A side of the case 14 and disposing the board main body section 30 on the near edge 14B side. In particular, it is possible to achieve a wedge shape in which the thickness of the side face of the case 14 gradually decreases from the far edge 14A side towards the near edge 14B side.

It is possible to achieve basic operations as a computer when at least the HDD 24, the ODD 26 and the radiator device 28 are provided as internal devices of the notebook computer 12. In such cases an optical disk is easily inserted into and taken out of the ODD 26 by disposing the HDD 24 towards the center along the far edge 14A of the case 14 and disposing the ODD 26 at an end portion along the far edge 14A, namely at a side face 14S side. Similarly, exhaust air can be efficiently externally exhausted from the case 14 by disposing the radiator device 28 at an end portion along the far edge 14A. Examples other than the HDD 24 of possible auxiliary storage devices that may serve as internal devices include for example a Solid State Drive (SSD). For a radiator device as an internal device, it is also possible to achieve a slimmer electronic device that includes a radiator device in a case by providing the radiator device as one of the internal devices.

The battery 38 and the display 20 are examples of external devices provided externally to the case 14. In particular, the battery 38 is often thicker than the HDD 24 and the ODD 26. Consequently, it is possible to achieve a wedge shape in which the side face gradually decreases in thickness from the far edge 14A side towards the near edge 14B side by disposing the battery 38 externally to the case 14 so as to run along the far edge 14A of the case 14.

Note that there is no limitation to the notebook computer described above as the electronic device. Application may, for example, also be made to a desktop computer, to an integrated-display style of computer, to a mobile phone, to an electronic dictionary, or to a mobile audio or video player.

Explanation has been given above regarding exemplary embodiments of technology disclosed herein, however the technology disclosed herein is not limited by the above, and obviously various other modifications may be implemented within a range not departing from the spirit thereof.

The technology disclosed herein enables a thinner case to be achieved for an electronic device, and enables wiring inside a case to be simplified.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. An electronic device comprising:
    a case;
    a board disposed inside the case and including a board main body section;
    a plurality of internal devices that are disposed inside the case at different positions from the board in plan view of the board and that are thicker than the board;
    a board extension portion that extends out from the board main body section between the plurality of internal devices;
    a board-side connection terminal that is provided at the board extension portion and is employed to connect to one of the internal devices or to an external device external to the case; and
    an internal device-side connection terminal that is provided at one or more of the internal devices and is connected to the board-side connection terminal.

2. The electronic device of claim 1, wherein the plurality of internal devices are disposed along one edge of the case in plan view.

3. The electronic device of claim 2, wherein the board main body section is disposed at a position further away from the one edge of the case than one or more of the internal devices.

4. The electronic device of claim 1, wherein the board-side connection terminal and the internal device-side connection terminal are placed in close proximity to each other and connected together by movement in a board thickness direction.

5. The electronic device of claim 1, wherein:
   at least some of the plurality of internal devices are disposed adjacent to each other; and
   the internal device-side connection terminals of the adjacent plurality of the internal devices are provided on facing sides of the internal devices at positions displaced from each other along a length direction of the facing sides.

6. The electronic device of claim 1, wherein a central processing unit is provided at the board main body section.

7. The electronic device of claim 1, wherein a display that receives a signal from the board and displays data is attached to one side of the case.

8. The electronic device of claim 1, wherein at least one of the plurality of internal devices includes a rotation shaft that has an axial direction oriented along a board thickness direction.

9. The electronic device of claim 8, wherein the internal devices that includes the rotation shaft among the plurality of internal devices is a storage device that rotates a storage medium at the periphery of the rotation shaft.

10. The electronic device of claim 9, wherein:
    a hard disk drive and an optical disk drive are each provided as the storage device; and
    the optical disk drive is disposed at a side face side of the case.

11. The electronic device of claim 1, wherein at least one of the plurality of internal devices is a radiator device that externally radiates heat from inside the case.

12. The electronic device of claim 11, wherein the radiator device is disposed at a side face side of the case.

13. The electronic device of claim 1, further comprising a plurality of the board extension portions.

14. The electronic device of claim 13, further comprising a frame shaped portion formed by coupling together leading ends of the plurality of board extension portions with a board coupling portion.

15. The electronic device of claim 13, further comprising a wiring line pattern employed to connect together a plurality of the internal devices or the external device distributed across a plurality of the board extension portions.

16. The electronic device of claim 1, wherein:
    the external device includes at least a battery; and
    the battery is attached outside the case at one side of the case.

* * * * *